United States Patent
Yamamoto et al.

(10) Patent No.: US 8,460,803 B2
(45) Date of Patent: Jun. 11, 2013

(54) HARD COATING LAYER AND METHOD FOR FORMING THE SAME

(75) Inventors: Kenji Yamamoto, Hyogo (JP); Albir A. Layyous, Me'ilya (IL)

(73) Assignees: Kabushiki Kaisha Kobe Seiko Sho, Kobe-shi (JP); Iscar Ltd., Tefen (IL)

( * ) Notice: Subject to any disclaimer, the term of this patent is extended or adjusted under 35 U.S.C. 154(b) by 243 days.

(21) Appl. No.: 12/997,082

(22) PCT Filed: Mar. 31, 2009

(86) PCT No.: PCT/JP2009/056706
§ 371 (c)(1),
(2), (4) Date: Dec. 9, 2010

(87) PCT Pub. No.: WO2009/150887
PCT Pub. Date: Dec. 17, 2009

(65) Prior Publication Data
US 2011/0086233 A1   Apr. 14, 2011

(30) Foreign Application Priority Data
Jun. 9, 2008 (JP) .................................. 2008-150662

(51) Int. Cl.
*B32B 9/00* (2006.01)
(52) U.S. Cl.
USPC ............... 428/697; 204/192.1; 204/192.15; 204/192.16; 204/192.23; 428/446; 428/698; 428/699

(58) Field of Classification Search
USPC   204/192.1, 192.15, 192.16, 192.23; 428/446, 428/697, 698, 699
See application file for complete search history.

(56) References Cited

U.S. PATENT DOCUMENTS

| 5,225,032 | A | * | 7/1993 | Golecki ......................... 117/90 |
| 5,662,965 | A | | 9/1997 | Deguchi et al. |
| 6,506,483 | B1 | * | 1/2003 | Fehrenbacher et al. ... 428/293.4 |
| 7,258,912 | B2 | * | 8/2007 | Yamamoto et al. ........... 428/697 |

(Continued)

FOREIGN PATENT DOCUMENTS

| EP | 2 295 616 A1 | 3/2011 |
| JP | 2005 213613 | 8/2005 |

(Continued)

OTHER PUBLICATIONS

Laidani et al "Spectroscopic characterization of thermally treated carbon-rich Si(1-x)C(x) films",Thin Solid Films 223 (1993) p. 114-121.*

(Continued)

*Primary Examiner* — Archene Turner
(74) *Attorney, Agent, or Firm* — Oblon, Spivak, McClelland, Maier & Neustadt, L.L.P.

(57) ABSTRACT

Disclosed is a crystalline hard coating layer having no cracks, which exhibits both high hardness and excellent wear resistance at the same time. A method for forming the hard coating layer is also disclosed. A crystalline hard coating layer (3) coating a substrate (2) is formed by a PVD method, and contains Si and C as essential components, while containing an element M (which is one or more elements selected from among group 3A elements, group 4A elements, group 5A elements, group 6A elements, B, Al and Ru) and N as optional components. The crystalline hard coating layer (3) has the following composition: $Si_xC_{1-x-y-z}N_yM_z$ (where $0.4 \leq x \leq 0.6$, $0 \leq y \leq 0.1$, and $0 \leq z \leq 0.2$).

14 Claims, 3 Drawing Sheets

U.S. PATENT DOCUMENTS

| | | | |
|---|---|---|---|
| 7,294,416 B2 * | 11/2007 | Yamamoto et al. | 428/698 |
| 7,758,974 B2 | 7/2010 | Yamamoto et al. | |
| 2005/0170162 A1 | 8/2005 | Yamamoto et al. | |
| 2007/0218242 A1 | 9/2007 | Moriguchi et al. | |
| 2007/0278090 A1 | 12/2007 | Yamamoto et al. | |

FOREIGN PATENT DOCUMENTS

| | | |
|---|---|---|
| JP | 2005 213637 | 8/2005 |
| JP | 2006 062075 | 3/2006 |
| JP | 2007 90483 | 4/2007 |
| JP | 2007 222995 | 9/2007 |
| JP | 2007 291471 | 11/2007 |

OTHER PUBLICATIONS

Rubel et al "IR spectroscopy and structure of RF magnteron sputtered a-SiC:H Films", phys.stat. sol. (1987) (b) vol. 139 p. 131-143.*

Lattemann et al "Investigation of structure and mechanical properties of magnetron sputtered monolayer and multilayer coatings in the ternary system Si-B-C", Surface & Coatings Tech. 201 (2007) p. 5564-5569.*

Gulbinski et al "Ti-Si-C sputter deposited thin film coatings" Surface & Coatings Tech. 180-181 (2004) p. 341-346.*

Endrino et al "Nanostructure and mechanical properties of WC-SiC", J. Mater. Res vol. 17, No. 12, (2002) p. 3163-3167.*

Ziegele et al "Studies of tribological and mechanical properties of laminated CrC-SiC coatings produced by r.f. and d.c. sputtering", Tribology International vol. 30 No. 12 (1997) p. 845-856.*

Holleck et al "Multilayer PVD coatings for wear protection", Surface & Coatings Tech. 76-77 (1995) p. 328-336.*

Knotek, O., et al., "Amorphous SiC PVD coatings," Diamond and Related Materials, vol. 2, pp. 528-530, (1993).

International Search Report issued May 19, 2009 in PCT/JP09/056706 filed Mar. 31, 2009.

Office Action issued Apr. 27, 2009, in Japanese Patent Application No. 2008-150662, filed Jun. 9, 2008 (with English language translation).

Office Action issued Mar. 26, 2012 in Chinese Patent Application No. 200980121455.6 (with English translation).

Korean Office Action issued Jun. 19, 2012 in Patent Application No. 10-2011-7000373 with English Translation.

Extended European Search Report issued Oct. 4, 2011, in Patent Application No. 09762318.5.

M. Lattemann, et al., "Investigation and characterisation of silicon nitride and silicon carbide thin films", Surface and Coatings Technology, vol. 174-175, XP 55007969, Oct. 2003, pp. 365-369.

H. Leiste, et al., "Microstructure and properties of multilayer coatings with covalent bonded hard materials", Surface and Coatings Technology, vol. 116-119, XP 27345991, Sep. 1999, pp. 313-320.

* cited by examiner

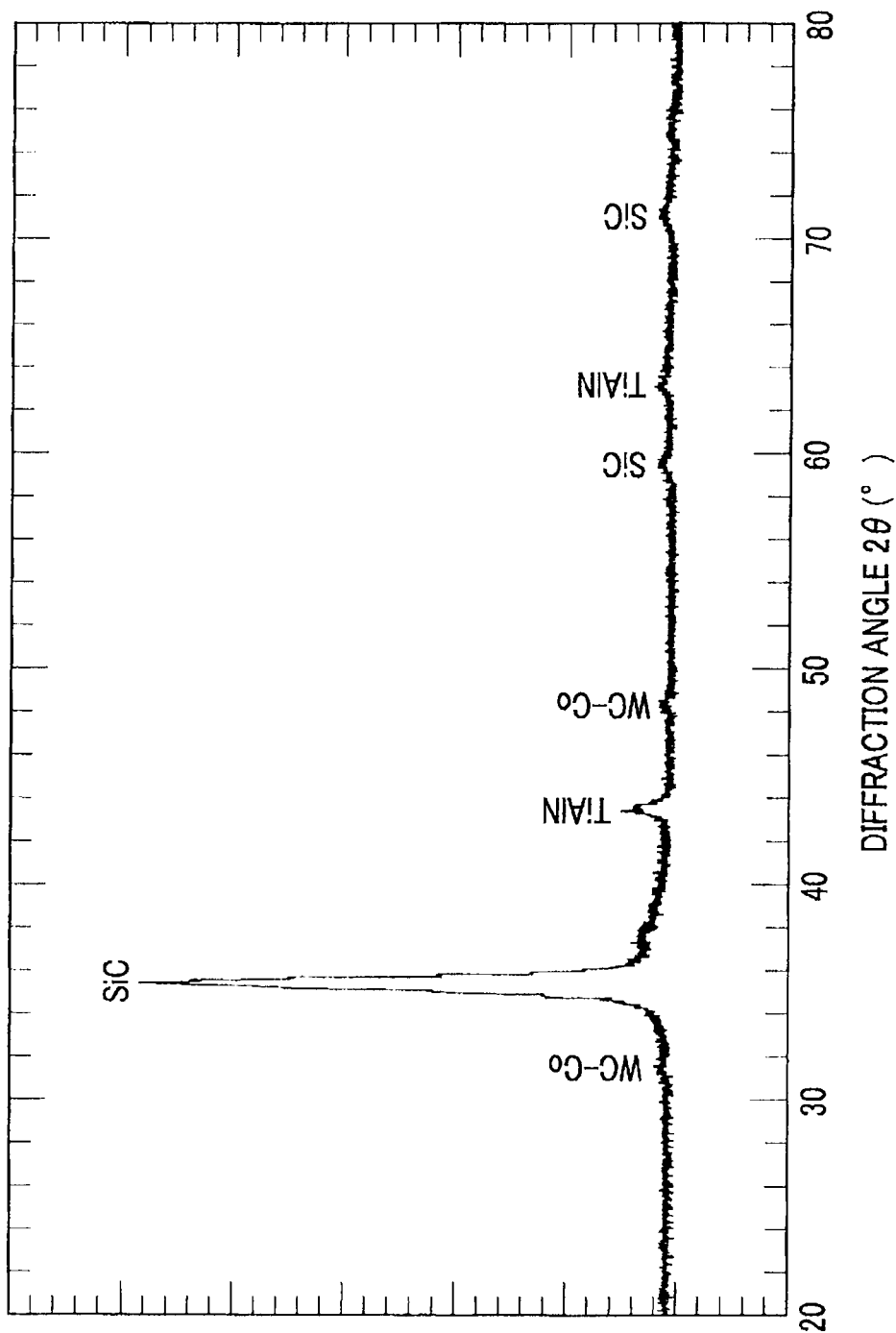

HARD COATING LAYER AND METHOD FOR FORMING THE SAME

TECHNICAL FIELD

The present invention relates to a hard coating layer that is used in applications which require excellent wear resistance, such as cutting tools and sliding members. The present invention also relates to a method of forming a hard coating layer.

BACKGROUND ART

Since SiC (silicon carbide) has a hardness equal to or greater than 40 GPa and is expected to be applied to cutting tools and the like, it has an excellent oxidation resistance and wear resistance in a form of bulk ceramics. (See, for example, Japanese Patent Application Laid-Open Publication No. 2007-90483 as Patent Document 1, and Knotek et al. "Amorphous SiC PVD Coatings", Diamond and Related Materials, 2(1993), pp. 528-530 as Non Patent Document 1.) In paragraphs [0031], [0035], first and second embodiment etc. of Patent Document 1, cluster ions are excited from an SiC sintered body by using an RF magnetron sputtering method or the like and the generated cluster ions are deposited on a substrate, to form an SiC coating layer on a surface of the substrate. In Non Patent Document 1, an SiC coating layer is formed by using a magnetron sputter ion plating method.

DISCLOSURE OF INVENTION

Technical Problem

However, because the SiC coating layers disclosed in Patent Document 1 and Non-Patent Document 1 are amorphous, the amorphous SiC coating layers do not have sufficiently high hardness and wear resistance. Although Non-Patent Document 1 describes that the amorphous SiC coating layer is crystallized when it is heat-treated at a high temperature, Patent Document 1 also describes that the SiC coating layer has a problem that cracks are generated in the SiC coating layer when the SiC coating layer is crystallized. Such an SiC coating layer having cracks therein is not suitable for practical use.

The present invention was made in view of this situation, and an object of the present invention is to provide a hard coating layer having no crack therein and having both high hardness and superior wear resistance. Another object of the present invention is to provide a method of forming the hard coating layer.

Technical Solution

Having analyzed the above problems earnestly, the inventors found that a crystalline SiC film can be formed without causing cracks by controlling coating-forming conditions of a PVD method and thus completed the present invention. It is noted that, in the present invention, "crystalline" is understood to have full width of half maximum of an SiC peak equal to or smaller than 3° measured between 34° and 36° of diffraction angle when X-ray diffraction (XRD) is carried by using a CuKα ray. The crystalline in the present invention includes not only coatings substantially considered to be the SiC crystal but also coatings forming a compound structure having the SiC crystal and the amorphous SiC.

That is, the hard coating layer according to Claim 1 of the present invention is a hard coating layer which is formed by using a PVD method and coats a predetermined substrate. The hard coating layer has a composition of $Si_xC_{1-x-y-z}N_yM_z$ (where $0.4 \leq x \leq 0.6$, $0 \leq y \leq 0.1$, and $0 \leq z \leq 0.2$), where Si and C are essential components, and an element M (at least one element selected from among group 3A elements, group 4A elements, group 5A elements, group 6A elements, B, Al, and Ru) and N are optional components and a full width of half maximum of an SiC peak measured between 34° and 36° of diffraction angle is equal to or smaller than 3° when X-ray diffraction (XRD) is carried by using a CuKα ray.

By using a crystalline SiC coating layer as a hard coating for coating the substrate, the hardness of the hard coating layer is enhanced dramatically, and a superior wear resistance. By doping N by an amount within the above specified range to the hard coating layer, only the Young's modulus of the hard coating layer can be decreased while maintaining the hardness of the hard coating layer. This increases the amount of elastic deformation when external stress is applied to the hard coating layer, thus suppressing the occurrence of a crack or the like in the hard coating layer. Since the element M strongly bonds with C and N, i.e., non-metal elements, the hardness of the hard coating layer can be enhanced by doping the element M to the hard coating layer within the specified range.

In the hard coating layer according to Claim 1, the hard coating layer according to Claim 2 of the present invention is characterized that the crystalline structure of the $Si_xC_{1-x-y-z}N_yM_z$ belongs to cubic crystal system.

This structure can enhance the hardness of the hard coating layer.

The hard coating layer according to Claim 3 of the present invention is formed by a PVD method. The hard coating layer according to Claim 3 has a structure where at least a first coating layer and at least a second coating layer are alternately layered alternately. The first coating layer is a hard coating layer which is formed on the surface of the predetermined substrate and coats the substrate. The first coating layer is made of a nitride, a carbonitride, or a carbide which contains at least one element selected from among group 4A elements, group 5A elements, and group 6A elements as an essential component and contains at least one element selected from among group 3A elements, Si, Al, and B as an optional component. The second coating layer has a composition of $Si_xC_{1-x-y-z}N_yM_z$ (where $0.4 \leq x \leq 0.6$, $0 \leq y \leq 0.1$, and $0 \leq z \leq 0.2$), where Si and C are essential components, and where elements M (at least one element selected from among group 3A elements, group 4A elements, group 5A elements, group 6A elements, B, Al, and Ru) and N are optional components. A full width of half maximum of an SiC peak measured between 34° and 36° of diffraction angle is equal to or smaller than 3° when X-ray diffraction is carried out by using a CuKα ray.

As compared with the second hard coating layer, the chemical compound constituting the first coating layers has superior adhesiveness to the substrate. Thus, with the above configuration, the adhesiveness between the substrate and the hard coating layer is enhanced. In addition, when the present invention is applied to cutting tools, the deformation of the substrate by external force is reduced since the first coating layer has a hardness greater than that of hard alloys or high-speed tool steel used for cutting tools. As a result, it is possible to prevent cracking or peeling off of the entire hard coating layer, and thus excellent durability may be obtained. The hardness of the entire hard coating layer is enhanced more greatly, because the interfacial structure is introduced within the hard coating layer when the hard coating layer is constructed so as to have a multi-layered structure having two or more layers of the first film and the second film,.

In the present invention, the invention according to Claim 4 and Claim 5 relates to a method for forming the hard coating layer according to Claim 1 and Claim 2, and simultaneously, the invention according to Claim 4 and Claim 5 relates to a method for forming the second coating layer composing the hard coating layer of Claim 3.

That is, a method according to Claim 4 of the present invention relates to the method of forming a hard coating layer on a surface of a substrate, characterized in that the hard coating layer has a composition of $Si_xC_{1-x-y-z}N_yM_z$ (where $0.4 \leq x \leq 0.6$, $0 \leq y \leq 0.1$, and $0 \leq z \leq 0.2$) on the surface of the predetermined substrate, where M is at least one element selected from among group 3A elements, group 4A elements, group 5A elements, group 6A elements, B, Al, and Ru; and a full width of half maximum of an SiC peak measured between 34° and 36° of diffraction angle is equal to or smaller than 3° when X-ray diffraction (XRD) is carried out by using a CuKα ray, and wherein the hard coating layer is formed on the surface of the substrate by using a PVD method wherein the substrate being kept at a predetermined temperature between 400° C. and 800° C. and a predetermined bias voltage of −30 to −300 V being applied to the substrate.

This method allows the crystalline hard coating layer having high hardness to be formed without causing cracks because the film is formed by using the PVD method keeping the substrate at the predetermined temperature and applying the predetermined bias voltage.

The invention according to Claim 5 of the present invention uses a magnetron sputtering method as the PVD method, and can obtain a significant effect of forming the crystalline hard coating layer having the high hardness and few cracking.

The invention according to Claim 6 of the present invention relates to a method of forming the first coating layer composing the hard coating layer of Claim 3 of the present invention. That is, the method according to Claim 6 of the present invention for forming the hard coating layer is characterized in that an additional hard coating layer is formed which is made of a nitride, a carbonitride, or a carbide containing at least one element selected from among group 4A elements, group 5A elements, and group 6A elements as an essential component and at least one element selected from among group 3A elements, Si, Al, and B as an optional component. Here, the "additional hard coating layer" corresponds to the first coating layer.

This method enables forming of the additional hard coating layer (first coating layer) having an excellent adhesiveness to the substrate.

The invention according to Claim 7 of the present invention is characterized in that, in the method according to Claim 6 for forming the hard coating layer, an operation of forming the additional hard coating layer and an operation of forming the hard coating layer are repeated alternately by a plurality of times.

This method enables forming of the hard coating layer having the higher hardness to be formed because the many more interfacial structures are introduced within the hard coating layer.

Effects of the Invention

According to Claim 1 and Claim 2, since the SiC coating layer having high hardness and having no crack is formed on the substrate, the excellent wear resistance may be obtained. According to Claim 3, a hard coating layer having excellent adhesiveness can be obtained since the first coating layer is formed on the surface of the substrate and since the SiC film as the second coating layer having high hardness is formed on the first coating layer. In addition, the hardness of the entire hard coating layer can be enhanced further by having the structure in which at least two first coating layers and at least two second coating layers are layered.

By using each method according to Claim 4 and Claim 5, for forming the hard coating layer, the crystalline hard coating layer having the high hardness and excellent wear resistance can be formed without causing cracks. By using the method according to Claim 6 for forming the hard coating layer, the hard coating layer having the excellent adhesiveness to the substrate can be formed because the additional hard coating layer, i.e., the first coating layer is formed. By using the method according to Claim 7 for forming the hard coating layer, the hard coating layer having the higher hardness can be formed because a multi-layered structure having the plurality of the hard coating layers and the additional hard coating layers.

BRIEF DESCRIPTION OF DRAWINGS

FIG. 3 is an XRD chart of a sample in which a TiAlN coating and a cubic crystal SiC coating are formed on the surface of a substrate composed of cemented carbide.

EXPLANATION OF REFERENCE

| | |
|---|---|
| 1A, 1B, 1C | member |
| 2 | substrate |
| 3 | hard coating layer (single layer structure) |
| 4 | first coating layer |
| 5 | second coating layer |
| 6 | hard coating layer (double layer structure) |
| 7 | hard coating layer (multi layer structure) |
| 10 | chamber |
| 12 | gas supply mechanism |
| 14 | stage |
| 16 | heater |
| 18 | sputtering vapor source |
| 22 | arc vapor source |
| 24 | bias power supply |
| 26 | sputtering power supply |
| 28 | arc power supply |
| 100 | complex coating-layer-forming apparatus |

BEST MODE FOR CARRYING OUT THE INVENTION

[First Embodiment]

Figure 1A:
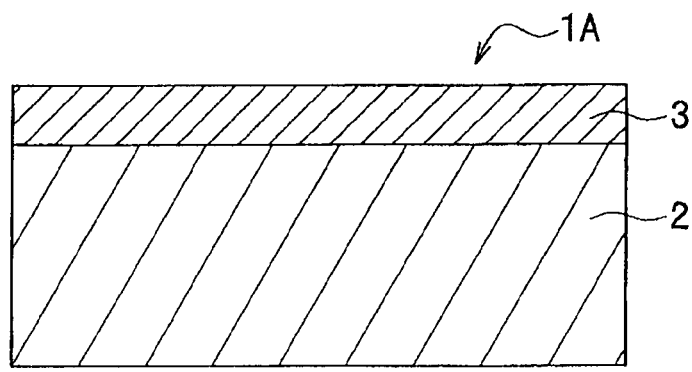
FIG. 1A is a schematic cross-sectional view of a member having a hard coating layer according to a first embodiment of the present invention.

FIG. 1A is a schematic sectional view of a member 1A having a hard coating layer according to a first embodiment of the present invention. The member 1A has a structure in which the surface of a substrate 2 is coated by a hard coating layer 3.

A metallic material such as iron-base alloy and cemented carbide, cermet, and ceramics are suitably used as the substrate 2. In particular, the cemented carbide can be used preferably as the substrate 2 when the member 1A is used as a cutting tool.

The hard coating layer 3 has a single-layer structure. The hard coating layer 3 has a composition of $Si_xC_{1-x-y-z}N_yM_z$ (where $0.4 \leq x \leq 0.6$, $0 \leq y \leq 0.1$, and $0 \leq z \leq 0.2$) having Si (silicon) and C (carbon) as essential components and N (nitrogen) and an element M as optional components. The element M is at least one element selected from among group 3A elements, group 4A elements, group 5A elements, and group 6A elements, B, Al, and Ru in the periodic table.

The hard coating layer 3 is crystalline. It is noted that "crystalline" is understood to have a full width half maximum (FWHM) of an SiC peak equal to or smaller than 3° measured between (2θ) 34° and 36° of diffraction angle when X-ray diffraction (XRD) is measured by using a CuKα ray. "Crystalline" includes not only those substantially considered to be the SiC crystal but also a complex organization in which SiC crystal and amorphous SiC co-exist. To be more specific, the peak measured between 34° and 36° corresponds to a peak for a [111] face of a cubical crystal SiC. The hard coating layer 3 made of the $Si_xC_{1-x-y-z}N_yM_z$ shows high hardness if the crystal structure of the $Si_xC_{1-x-y-z}N_yM_z$ belongs to cubic crystal system.

In order to make the hard coating layer 3 crystalline, the atomic ratio x of Si is set between 0.4 and 0.6. N is added into the hard coating layer 3 if necessary. N is solid-solubilized into $Si_xC_{1-x}$ and occupies a site of C. It is possible to reduce only Young's modulus while maintaining the hardness of the hard coating layer 3 by setting the atomic ratio y of N at $0 < y \leq 0.1$ and by making the composition of the hard coating layer 3 as $Si_xC_{1-x-y}N_y$. If the Young's modulus of the hard coating layer 3 decreases, cracking is prevented in the hard coating layer 3 since an elastic deformation of the hard coating layer 3 increases when an external stress is applied thereto. The hardness of the hard coating layer 3 decreases since the hard coating layer 3 is amorphized if the atomic ratio y of N exceeds 0.1. Therefore, the atomic ratio y is set equal to or smaller than 0.1 when N is added to the hard coating layer 3. More preferably, the atomic ratio y of N is set to be equal to or smaller than 0.05.

The element M bonds with non-metal elements C and N firmly. The hardness of the hard coating layer 3 can be enhanced by making the composition of the hard coating layer 3 $Si_xC_{1-x-y}M_z$, where the atomic ratio z of the element M is set within $0 < z \leq 0.2$. The hardness of the hard coating layer 3 decreases if the atomic ratio z of the element M exceeds 0.2. Therefore, the atomic ratio z is set equal to or smaller than 0.2 if the element M is added into the hard coating layer 3. More preferably, the atomic ratio z of the element M is set equal to or smaller than 0.05. Preferably, the elements M are B, Cr, V, and Ti. Among these elements, B is the most preferable.

Two effects, i.e., an effect of the N added in the hard coating layer 3 and an effect of the element M added into the hard coating layer 3, can be obtained by doping both the N and the element M into $Si_xC_{1-x}$ to set the composition of the hard coating layer 3 as $Si_xC_{1-x-y-z}N_yM_z$.

It is preferable that, in $Si_xC_{1-x-y-z}N_yM_z$, the total amount (y+z) of the atomic ratio y of N and the atomic ratio z of the element M is set equal to or smaller than 0.1 in order to maintain the hard coating layer 3 of the cubic crystal structure.

The thickness of the hard coating layer 3 is determined appropriately according to an intended application of the member 1A. For instance, if the member 1A is applied to a cutting tool such as an insert, a drill, and an end mill, the thickness of the hard coating layer 3 is preferable to be equal to or greater than 0.5 μm. If the member 1A is used as a jig and a tool for a casting die and a punching instrument, the thickness of the hard coating layer 3 is preferable to be equal to or greater than 1 μm. It is preferable that the thickness of the hard coating layer 3 is equal to or smaller than 5 μm from a viewpoint of improving productivity in a coating process explained as follows.

The hard coating layer 3 is formed by using a PVD method using a component of the composition of an intended hard coating layer 3. In the PVD method, a target composed of a predetermined component is always used. The target used here does not necessarily include all of the components to be included in the composition of the intended hard coating layer 3. Some components may be gas supplied to a processing atmosphere. "Using a component of the composition of an intended hard coating layer 3" means that the component of the composition of the hard coating layer 3 is included in the sputtering target or in the gas.

The PVD method described above may be a cathodic discharge arc ion plating method using an SiC target or a reactive vapor-deposition method that melts and evaporates Si by using an electron beam in a hydro carbon atmosphere. A magnetron sputtering method may be used to promote the crystallization of the hard coating layer 3 by ion radiation. For that purpose, an unbalanced magnetron sputtering method is particularly preferable. In the unbalanced magnetron sputtering method, the ion radiation to the substrate 2 is enhanced by breaking the balance of magnets disposed on the back side of the sputtering target intentionally. The method for forming a coating layer of the present invention will be explained below by exemplifying the magnetron sputtering method.

In the magnetron sputtering method for forming the hard coating layer 3, a sputtering target containing at least Si that is the essential component of the composition of the hard coating layer 3, i.e., $Si_xC_{1-x-y-z}N_yM_z$, is used. Another sputtering target or gas is used as a source of other components not contained in the sputtering target which contains at least Si. If the sputtering target containing at least Si contains one of or both of C and N, gas containing C and gas containing N may be used together. The general structure of a magnetron sputtering apparatus which can be used suitably when forming the hard coating layer 3 will be explained in detail in embodiments described later.

A specific example of forming the crystalline hard coating layer 3 having a composition of $Si_xC_{1-x}$ (where $0.4 \leq x \leq 0.6$) on the surface of the substrate 2 will be explained. At first, the temperature of the substrate 2 is maintained in a predetermined range of 400° C. to 800° C. under a predetermined decompressed atmosphere, and the state of the substrate to which a predetermined bias voltage in a range of −30 V to −300 V is applied is maintained. In this state, the hard coating layer 3 is formed on the surface of the substrate 2 by using the magnetron sputtering method with a sputtering target which is a sintered body having the composition of $Si_xC_{1-x}$.

An amorphous $Si_xC_{1-x}$ coating layer is likely to be formed if the temperature of the substrate 2 is below 400° C. when forming the hard coating layer 3. On the other hand, if the temperature of the substrate 2 exceeds 800° C., a possibility of causing thermal deterioration in the substrate 2 increases. Therefore, the temperature of the substrate 2 is maintained at the predetermined range of 400° C. to 800° C.

In order to accelerate the crystallization of the hard coating layer 3, it is preferable to set the temperature of the substrate 2 equal to or higher than 500° C. From a view point of preventing the thermal deterioration of the substrate 2, it is preferable to keep the temperature of the substrate 2 equal to or lower than 700° C.

Ions generated by the magnetron sputtering method cannot be fully accelerated and cannot be hit against the substrate 2 if an absolute value of the bias voltage applied to the substrate 2 is lower than 30 V. In this case, an amorphous $Si_xC_{1-x}$ coating layer is likely to be formed. On the other hand, if the bias voltage having an absolute value exceeding 300V is applied to the substrate 2, the $Si_xC_{1-x}$ coating layer to be formed becomes amorphous and is softened because the impact of the ions during the hard-coating-layer-forming process is too strong. In addition, there is a problem that the deposition rate of forming the hard coating layer decreases because the temperature of the substrate 2 rises and an etching effect of ions increases.

It is not necessary to use the sintered body having the composition of $Si_xC_{1-x}$ as the sputtering target when forming the hard coating layer 3 with the composition of $Si_xC_{1-x}$. For instance, it is possible to carry out the magnetron sputtering method by using a sputtering target which is a sintered body made of only Si, and supplying the gas containing carbon (e.g., acetylene ($C_2H_2$) and methane ($CH_4$) etc.) as a source of C into the sputtering process atmosphere.

Even if the sputtering target includes all the components, a gas including specific components may be supplied to the sputtering process atmosphere to conduct the magnetron sputtering method. In this case, it is possible to form the hard coating layer 3 having a different composition from the composition of the sputtering target. For instance, the magnetron sputtering method may be carried out by using a sputtering target which is a sintered body with a composition of SiC (where x=0.5 in $Si_xC_{1-x}$) and supplying a gas containing carbon into the sputtering atmosphere as the source of C. By doing this way, the hard coating layer 3 with a composition of $Si_xC_{1-x}$ ($0.4 \leq x < 0.5$) can be formed.

In order to form the hard coating layer 3 having a composition of $Si_xC_{1-x-y-z}N_y$ ($0<y\leq 0.1$) by adding N, for example, the magnetron sputtering method may be carried out by using a $Si_xC_{1-x-y-z}N_y$ sintered body as a sputtering target. Alternatively, the magnetron sputtering method may be carried out by using an SiC sintered body as a sputtering target and supplying $N_2$ gas as a source of N to the processing atmosphere. Further alternatively, the magnetron sputtering method may be carried out by using a sputtering target composed of Si and by supplying the gas containing carbon as the source of C and the $N_2$ gas as the source of N.

In order to form the hard coating layer 3 having a composition of $Si_xC_{1-x-z}M_z$ ($0<z\leq 0.2$) by adding the element M, for example, the magnetron sputtering method may be carried out by using a sputtering target of $Si_xC_{1-x-z}M_z$ sintered body. Alternatively, the magnetron sputtering method may be carried out by using the sputtering target of the $Si_xC_{1-x}$ sintered body and the sputtering target made of the element M simultaneously. Further alternatively, the magnetron sputtering method may be carried out by using the sputtering target made of Si and the sputtering target made of the element M, and supplying the gas containing carbon as the source C into the processing atmosphere.

In order to form the crystal hard coating layer 3 having the composition of $Si_xC_{1-x-y-z}N_yM_z$ (where $0<y\leq 0.1$ and $0<z\leq 0.2$) by adding N and the element M, the magnetron sputtering method may be carried out by supplying the $N_2$ gas as the source of N to the processing atmosphere in the aforementioned method for forming the film composed of $Si_xC_{1-x-z}M_z$ ($0<z\leq 0.2$). Alternatively, the magnetron sputtering method may be carried out by using a $Si_xC_{1-x-y-z}N_yM_z$ sintered body as a sputtering target.

[Second Embodiment]

Figure 1B:
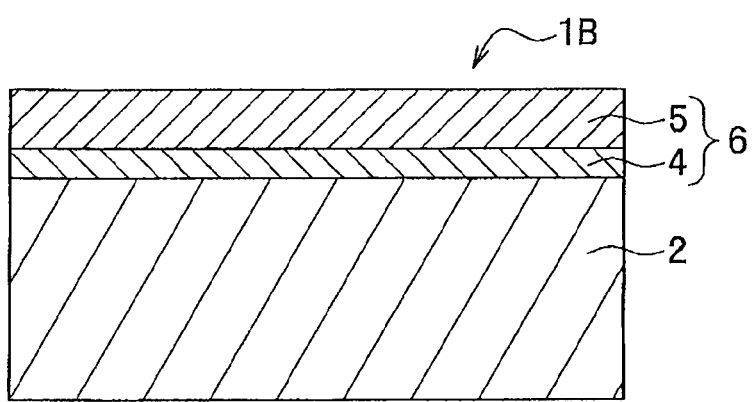
FIG. 1B is a schematic cross-sectional view of a member having a hard coating layer according to a second embodiment of the present invention.

FIG. 1B is a schematic cross-sectional view of a member 1B having a hard coating layer according to a second embodiment of the invention. The member 1B has a structure in which the surface of the substrate 2 is coated with a hard coating layer 6. The hard coating layer 6 has a double-layered structure having a first coating layer 4 formed on the surface of the substrate 2 and a second coating layer 5 provided on the first coating layer 4.

The substrate 2 included in the member 1B is the same as the substrate 2 included in the member 1A (shown in FIG. 1A). The second coating layer 5 included in the hard coating layer 6 is substantially the same as the hard coating layer 3 included in the member 1A (shown in FIG. 1A). That is, the member 1B may be considered to have a structure in which a layer which corresponds to the first coating layer 4 is interposed between the substrate 2 included in the member 1A and the hard coating layer 3. Hereafter, a detailed explanation of the substrate 2 and the second coating layer 5 will be omitted.

The first coating layer 4 is composed of nitride, carbon nitride, or carbide, which contains at least one of elements selected from among group 4A elements, group 5A elements, group 6A elements as essential components and contains at least one of elements selected from among group 3A elements, Si, Al, and B as optional components. The first coating layer 4 described above has a more excellent adhesiveness onto the substrate 2 than the second coating layer 5. The second coating layer 5 has better adhesiveness to the first coating layer 4 than to the substrate 2. Accordingly, the hard coating layer 6 shows the excellent adhesiveness to the substrate 2 because the first coating layer 4 is provided on the surface of the substrate 2. That is, the member 1B can be said to be a member whose adhesiveness is improved between the substrate 2 and the hard coating layer 3 in the aforementioned member 1A. Cutting tools, jigs and tools, friction members exhibit an excellent durability when the configuration of the member 1B is applied thereto.

It is preferable that the first coating layer 4 is a nitride having at least one of Ti and Cr as essential components and having at least one of elements selected from among Y, Al and Si as optional components. To be specific, it is preferable that the first coating layer 4 is one of TiN, CrN, TiC, TiAlN, CrAlN, TiCrAlN, TiCrAlSiN, TiAlSiN, and TiCrAlSiYN. Among these nitrides, CrN, TiAlN, CrAlN, TiCrAlN, TiCrAlSiN, TiAlSiN, and TiCrAlSiYN, each of which contains Cr or Al, are suitable for application to cutting tools. This is because, if the first coating layer 4 is formed of a compound of Ti and optional components and if the first coating layer does not include Al, the oxidation resistance of the first coating layer 4 decreases and oxidation degradation occurs; thus lowering the cutting capability of a cutting tool using the first coating layer 4.

If the first coating layer 4 is too thin, the effect of improved adhesiveness to the substrate 2 cannot be obtained substantively. Therefore, it is preferable that the thickness of the first coating layer 4 is equal to or greater than 5 nm. As shown in the member 1B in FIG. 1B, if only one layer of the first coating layer 4 is formed on the surface of the substrate 2 and if only one layer of the second coating layer 5 is formed on the first coating layer 4, it is preferable that the thickness of the first coating layer 4 is equal to or greater than and it is more preferable that the thickness of the first coating layer 4 is equal to or greater than 2 μm. However, if the thickness of the first coating layer 4 exceeds 7 μm, the first coating layer 4 is likely to peel off due to the stress of the first coating layer 4. Therefore, it is preferable that the thickness of the first coating layer 4 is equal to or smaller than 7 μm. The thickness of the second coating layer 5 is the same as the thickness of the hard coating layer 3 formed in the member 1A described above.

An arc ion plating method using a target having the composition of the first coating layer 4 is suitable for forming the first coating layer 4 on the surface of the substrate 2. The second coating layer 5, which is an $Si_xC_{1-x-y-z}N_yM_z$ coating layer, is formed on the first coating layer 4 by using the magnetron sputtering method. In this case, it is preferable to use a coating-layer-forming apparatus which can selectively perform the magnetron sputtering method or the arc ion plating method to the substrate 2 mounted in its chamber. The deposition rate may be increased by using such a coating-layer-forming apparatus because the second coating layer 5 can be formed without moving the substrate 2 after forming the first coating layer 4. It is noted that a CVD method may be also used to form the first coating layer 4.

[Third Embodiment]

Figure 1C:
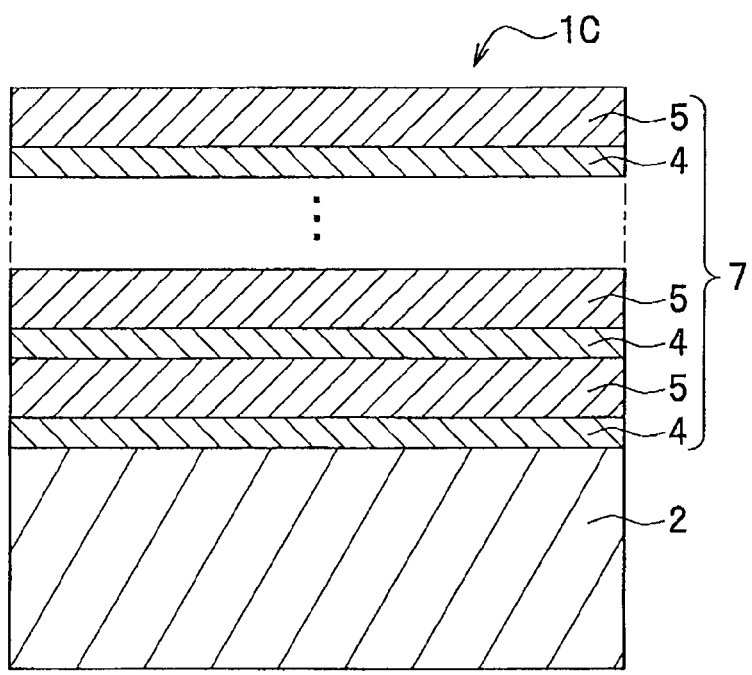
FIG. 1C is a schematic cross-sectional view of a member having a hard coating layer according to a third embodiment of the present invention.

FIG. 1C is a schematic cross-sectional view of a member having a hard coating layer according to a third embodiment of the present invention. The member 1C has a structure in which the surface of the substrate 2 is coated by a hard coating layer 7. The hard coating layer 7 has a multi-layered structure in which the first coating layer 4 and the second coating layer 5 are alternately laminated. The first coating layer 4 and the second coating layer 5 included in the hard coating layer 7 are substantially the same as the first coating layer 4 and the second coating layer 5 respectively which are included in the hard coating layer 6 formed in the member 1B described above. The first coating layer 4 having excellent adhesiveness onto the substrate 2 is formed on the surface of the substrate 2. Since the composition and crystal structure of the first coating layer 4 and of the second coating layer 5, and materials etc. for producing them have been described above, so hereafter explanation thereof will be omitted.

The "multi-layered structure" is a structure in which the total number of layers of the first coating layer 4 and the second coating layer 5 is equal to or greater than three. Because it is preferable to form the second coating layer 5 having an excellent wear resistance as a top surface layer when the member 1C is applied to cutting tools, it is preferable that the total number of the layers of the first coating layer 4 and the second coating layer 5 in the hard coating layer 7 is an even number equal to or greater than four. Because the hard coating layer 7 has a structure in which many interfacial structures are introduced, the hardness of the hard coating layer 7 is enhanced and the wear resistance is improved. Therefore, cutting tools or the likes using the member 1C have excellent durability.

It is preferable that each thickness of the first coating layer 4 and the second coating layer 5 is sufficiently smaller than the full thickness of the hard coating layer 7. The hardness of the hard coating layer 7 can be enhanced by forming many interfacial structures inside the hard coating layer 7. It is preferable that both of the thickness of the first coating layer 4 and the thickness of the second coating layer 5 are within the range of 5 nm to 500 nm, and more preferably within the range of 10 nm to 30 nm. The thickness of the first coating layer 4 need not be the same as that of the second coating layer 5. If a plurality of the first coating layers 4 are formed, the thickness of each first coating layer 4 need not be the same. Also, if a plurality of the second coating layers 5 are formed, the thickness of each second coating layer 5 need not be the same. The composition of each of the plurality of the first film layers 4 needs not be the same. The composition of each of the plurality of the second coating layers 5 also needs not be the same. It is preferable that the composition, the thickness, and the number of laminations of the first coating layer 4 and the second coating layer 5 are set appropriately so that an internal stress within the hard coating layer 7 caused due to the multiple layer structure is reduced.

As explained previously, it is preferable that, the first coating layer 4 is formed by using the arc ion plating method and the second coating layer 5 is formed by using the magnetron sputtering method. The hard coating layer 7 is formed by forming the first coating layer 4 and the second coating layer 5 by a predetermined number of times.

EXAMPLES

Examples of the invention will be explained below. It is noted that the invention is not limited to the following examples. In the following examples, samples having the structures of the member 1B and 1C are fabricated and evaluated.

<<Formation of a Hard Coating Layer on the Surface of a Substrate>>

[Outline of Coating-Layer-Forming Apparatus]

Figure 2:
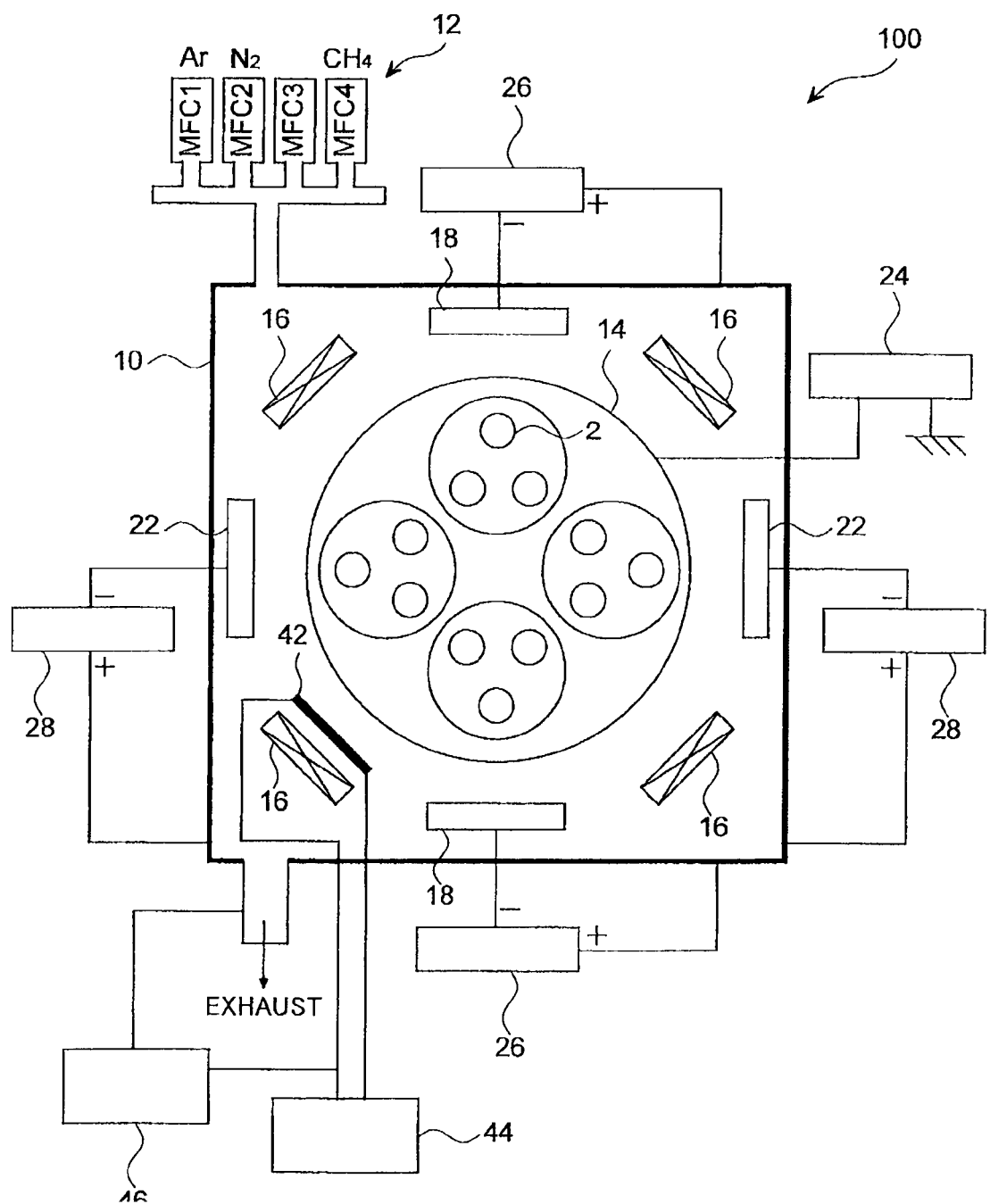
FIG. 2 is a schematic diagram of a multilayer-hard-coating apparatus of the invention.

FIG. 2 is a schematic diagram of a complex coating-layer-forming apparatus 100 used to form the first coating layer 4 and the second coating layer 5 on the substrate. The complex coating-layer-forming apparatus 100 includes a chamber 10, a vacuum pump (not shown in the drawing), a gas supply mechanism 12, a stage 14, a heater 16, an unbalanced magnetron sputtering vapor source (produced by Kobe Steel, Ltd., model number: UBMS202) 18 (hereinafter referred to as a sputter vapor source 18), a cathode discharge type of arc ion plating evaporation source 22 (hereinafter referred to as an arc evaporation source 22), a bias power supply 24, a sputtering power supply 26 and an arc power supply 28.

Ar gas, $N_2$ gas, $CH_4$ gas etc. are supplied from the gas supplying mechanism 12 into the chamber 10 depending on a coating-layer-forming process to be carried out. It is noted that MFC 1 though MFC 4 shown in FIG. 2 are mass flow controllers. An inside of the chamber 10 is vacuumed and adjusted to a necessary degree of vacuum level by the vacuum pump not shown in the drawing. The substrates 2, on which the first coating layer 4 and the second coating layer 5 are formed, are mounted on the stage 14. The substrate 2 mounted on the stage 14 is heated by the heater 16. A sputtering target for forming the second coating layer 5 is attached to the sputtering vapor source 18. For example, the sputtering target composed of $Si_xC_{1-x}$ is attached to one of the sputter vapor sources 18 and the sputtering target made of the element M is attached to the other one of the sputter vapor sources 18. A target composed of metal or alloy for forming the first coating layer 4 is attached to the arc evaporation source 22.

A bias voltage is applied to the stage 14 by the bias power source 24. More specifically, the bias voltage is applied to the substrate 2 mounted on the stage 14. The potential of the sputtering vapor source 18 is controlled by the sputtering power source 26 so that atoms, ions or clusters are generated from the sputtering vapor source 18. The electric potential of the arc evaporation source 22 controlled by the arc power source 28 so that atoms, ions or clusters are generated from the arc evaporation source 22.

It is noted that the complex coating-layer-forming apparatus 100 further includes a filament type ion source 42, an AC power supply 44 for carrying out an AC heating to the ion source 42, and a DC power source 46 for causing electric discharge from the ion source 42. The ion source 42 is not used in this example.

[Fabrication of Samples 1 to 25 ]

Samples 1 to 25 have the structures shown in FIG. 1B. Table 1 shows the compositions of the fabricated samples. Sputtering targets having different composition ratios of Si and C (referred to as "SiC targets" altogether hereinafter) were mounted to the sputtering vapor sources 18. Targets composed of TiAl were mounted to the arc vapor sources 22. As the substrate 2, a mirror-polished base member (JIS P Type) made of a cemented carbide, and a 2-flute ball end mill having a diameter of 10 mm and being made of the same cemented carbide as the mirror-polished substrate were used. These were mounted on the stage 14. It is noted that, as the SiC target, $Si_{0.3}C_{0.7}$ is used in the sample 1, $Si_{0.4}C_{0.6}$ is used in the sample 2, $Si_{0.5}C_{0.5}$ is used in the samples 3 and 6 to 25, $Si_{0.6}C_{0.4}$ is used in samples 4, and $Si_{0.7}C_{0.3}$ is used in sample 5, respectively.

second coating layer 5 (for its composition, see Table 1) having a thickness of about 3 μm was formed on the first coating layer 4. It is noted that the composition of the second coating layer 5 shown in Table 1 is represented by composition analysis values obtained by EDX, which will be described later.

TABLE 1

| sample No. | 1st coating layer | 2nd coating layer(*) Si ($_x$) | C ($_{1-x-y}$) | N ($_y$) | PVD condition bias (-V) | temp. (° C.) | mechanical property hardness (GPa) | Young's modulus (GPa) | E/H | crystal structure | FWHM (°) at peak in the vicinity of 2θ: 35° | wear amount (μm) | result |
|---|---|---|---|---|---|---|---|---|---|---|---|---|---|
| 1 | TiAlN | 0.32 | 0.68 | 0 | 75 | 550 | 27 | 300 | 11.1 | amorphous | 4 | 120 | comparative example |
| 2 | TiAlN | 0.41 | 0.59 | 0 | 75 | 550 | 38 | 450 | 11.8 | crystalline | 0.8 | 80 | embodiment |
| 3 | TiAlN | 0.5 | 0.5 | 0 | 75 | 550 | 44 | 510 | 11.6 | crystalline | 0.66 | 50 | embodiment |
| 4 | TiAlN | 0.58 | 0.42 | 0 | 75 | 550 | 37 | 440 | 11.9 | crystalline | 0.64 | 70 | embodiment |
| 5 | TiAlN | 0.7 | 0.3 | 0 | 75 | 550 | 24 | 280 | 11.7 | amorphous | 3.5 | 130 | comparative example |
| 6 | TiAlN | 0.5 | 0.5 | 0 | 0 | 600 | 27 | 320 | 11.9 | amorphous | not observed | 120 | comparative example |
| 7 | TiAlN | 0.5 | 0.5 | 0 | 30 | 600 | 36 | 410 | 11.4 | crystalline | 0.87 | 65 | embodiment |
| 8 | TiAlN | 0.5 | 0.5 | 0 | 75 | 600 | 43 | 495 | 11.5 | crystalline | 0.65 | 42 | embodiment |
| 9 | TiAlN | 0.5 | 0.5 | 0 | 150 | 600 | 44 | 520 | 11.8 | crystalline | 0.8 | 40 | embodiment |
| 10 | TiAlN | 0.5 | 0.5 | 0 | 200 | 600 | 40 | 480 | 12.0 | crystalline | 1.5 | 60 | embodiment |
| 11 | TiAlN | 0.5 | 0.5 | 0 | 300 | 600 | 38 | 460 | 12.1 | crystalline | 1.8 | 70 | embodiment |
| 12 | TiAlN | 0.5 | 0.5 | 0 | 400 | 600 | 28 | 330 | 11.8 | amorphous | not observed | 140 | comparative example |
| 13 | TiAlN | 0.5 | 0.5 | 0 | 75 | 200 | 26 | 300 | 11.5 | amorphous | 5.5 | 110 | comparative example |
| 14 | TiAlN | 0.5 | 0.5 | 0 | 75 | 300 | 27 | 310 | 11.5 | amorphous | 4.5 | 100 | comparative example |
| 15 | TiAlN | 0.5 | 0.5 | 0 | 75 | 400 | 40 | 455 | 11.4 | amorphous | 2.5 | 85 | embodiment |
| 16 | TiAlN | 0.5 | 0.5 | 0 | 75 | 400 | 40 | 455 | 11.4 | crystalline | 0.86 | 65 | embodiment |
| 17 | TiAlN | 0.5 | 0.5 | 0 | 75 | 500 | 44 | 540 | 12.3 | crystalline | 0.6 | 40 | embodiment |
| 18 | TiAlN | 0.5 | 0.5 | 0 | 75 | 600 | 44 | 530 | 12.0 | crystalline | 0.5 | 45 | embodiment |
| 19 | TiAlN | 0.5 | 0.5 | 0 | 75 | 700 | 38 | 440 | 11.6 | crystalline | 0.45 | 55 | embodiment |
| 20 | TiAlN | 0.5 | 0.5 | 0 | 75 | 800 | 38 | 432 | 11.4 | crystalline | 0.4 | 60 | embodiment |
| 21 | TiAlN | 0.5 | 0.5 | 0 | 75 | 900 | 38 | 432 | 11.4 | crystalline | 0.4 | Not evaluated because of thermal deterioration | comparative example |
| 22 | TiAlN | 0.5 | 0.48 | 0.02 | 75 | 500 | 43 | 450 | 10.5 | crystalline | 0.78 | 40 | embodiment |
| 23 | TiAlN | 0.5 | 0.45 | 0.05 | 75 | 500 | 41 | 420 | 10.2 | crystalline | 0.85 | 37 | embodiment |
| 24 | TiAlN | 0.5 | 0.4 | 0.1 | 75 | 500 | 40 | 400 | 10.0 | crystalline | 1.1 | 37 | embodiment |
| 25 | TiAlN | 0.5 | 0.35 | 0.15 | 75 | 500 | 25 | 284 | 11.4 | amorphous | not observed | 130 | comparative example |

(*)Composition of 2nd coating layer: $Si_xC_{1-x-y}N_y$

After the pressure inside the chamber 10 was evacuated to $1\times10^{-3}$ Pa or below, the substrate 2 was heated to 550° C. by the heater 16. After that, sputter cleaning using Ar ions (for cleaning the surface of the substrate 2) was performed. Then, $N_2$ gas was supplied into the chamber 10 so that the internal pressure became 4 Pa. With this internal pressure kept, an electric current of 150 A was supplied from the arc power supply 28 to the arc evaporation source 22 to generate arc discharge. In this way, a TiAlN coating layer as the first coating layer was formed on the surface of the substrate 2.

For samples 1 to 21, after the $N_2$ gas inside the chamber 10 was evacuated, Ar gas was introduced into the chamber 10 so that the pressure inside the chamber 10 became 0.6 Pa. For samples 22 to 25, after the $N_2$ gas inside the chamber 10 was exhausted, Ar gas and $N_2$ gas were supplied into the chamber 10 so that the pressure inside the chamber 10 became 0.6 Pa. The magnetron sputtering was performed with a bias voltage (i.e., bias voltage applied to the substrate 2) and at a temperature (i.e., the temperature of the substrate 2) as shown in the column of the PVD condition of table 1. In this way, the

[Fabrication of Samples 26 to 47]

Samples 26 to 47 have the structures shown in FIG. 1B. Table 2 shows the compositions of the fabricated samples. An SiC target ($Si_{0.5}C_{0.5}$) was mounted on one of the sputtering vapor sources 18. A target including the element M for forming the second coating layer 5 (see table 2) was mounted on the other one of the sputter vapor sources 18 each time according to a necessary composition of the second coating layer 5. Further, a target made of TiAl was mounted on the arc evaporation source 22. As the substrate 2, a mirror-polished substrate (JIS P Type) made of a cemented carbide, and a 2-flute ball end mill having a diameter of 10 mm and being made of the same cemented carbide as the mirror-polished substrate were used. These were mounted on the stage 14.

After the pressure inside the chamber 10 was lowered to $1\times10^{-3}$ Pa or below, the substrate 2 was heated to 550° C. by the heater 16. After that, sputter cleaning using Ar ions was performed. Then, $N_2$ gas was supplied to the chamber 10 so that the internal pressure became 4 Pa. In this state, an electric current of 150 A was supplied from the arc power supply 28 to the arc evaporation source 22 to generate arc discharge. In this way, a TiAlN coating layer as the first coating layer was formed on the surface of the substrate 2.

For samples 26 to 43, after the $N_2$ gas inside the chamber 10 was exhausted, Ar gas was introduced into the chamber 10 so that the pressure inside the chamber 10 became 0.6 Pa. For samples 44 to 47, after the $N_2$ gas inside the chamber 10 was exhausted, Ar gas and $N_2$ gas were supplied into the chamber 10 so that the pressure inside the chamber 10 became 0.6 Pa. The magnetron sputtering was performed with a bias voltage and at a temperature as shown in the column of the PVD condition of table 2. In this way, the second coating layer 5 (for its composition, see Table 2) having a thickness of about 3 μm was formed on the first coating layer 4. It is noted that the composition of the second coating layer 5 shown in Table 2 is represented by composition analysis values obtained by EDX, which will be described later.

carbide, and a 2-flute ball end mill having a diameter of 10 mm and being made of the same cemented carbide as the mirror-polished substrate were used. These were mounted on the stage 14.

After the pressure inside the chamber 10 was lowered to $1\times10^{-3}$ Pa or below, the substrate 2 was heated to 550° C. by the heater 16. After that, sputter cleaning using Ar ions was performed. Then, $N_2$ gas was supplied to the chamber 10 so that the internal pressure became 4 Pa. With this internal pressure kept, an electric current of 150 A was supplied from the arc power supply 28 to the arc evaporation source 22 to generate arc discharge. In this way, the first coating layer 4 which was composed of a nitride, a carbonitride, or carbide indicated in Table 3 was formed on the surface of the substrate 2. After the $N_2$ gas inside the chamber 10 was exhausted, Ar gas was introduced into the chamber 10 so that the internal pressure became 0.6 Pa. The magnetron sputtering was per-

| | | 2nd coating layer(*) | | | | | | mechanical property | | | | |
|---|---|---|---|---|---|---|---|---|---|---|---|---|
| | | | | | added component | PVD condition | | Young's | | | wear | |
| sample No. | 1st coating layer | Si ($x$) | C ($1-x-y-z$) | N ($y$) | ($z$) element M | bias (−V) | temp. (° C.) | hardness (GPa) | modulus (GPa) | E/H | crystal structure | amount (μm) | result |
| 26 | TiAlN | 0.5 | 0.49 | 0 | 0.01 B | 75 | 600 | 43 | 495 | 11.5 | crystalline | 42 | embodiment |
| 27 | TiAlN | 0.48 | 0.47 | 0 | 0.05 B | 75 | 600 | 50 | 530 | 10.6 | crystalline | 35 | embodiment |
| 28 | TiAlN | 0.45 | 0.45 | 0 | 0.1 B | 75 | 600 | 45 | 490 | 10.9 | crystalline | 40 | embodiment |
| 29 | TiAlN | 0.4 | 0.4 | 0 | 0.2 B | 75 | 600 | 42 | 460 | 11.0 | crystalline | 50 | embodiment |
| 30 | TiAlN | 0.4 | 0.3 | 0 | 0.3 B | 75 | 600 | 31 | 350 | 11.3 | crystalline | 110 | comparative example |
| 31 | TiAlN | 0.49 | 0.48 | 0 | 0.03 Sc | 75 | 600 | 43 | 475 | 11.0 | crystalline | 43 | embodiment |
| 32 | TiAlN | 0.49 | 0.48 | 0 | 0.03 Y | 75 | 600 | 45 | 485 | 10.8 | crystalline | 40 | embodiment |
| 33 | TiAlN | 0.49 | 0.48 | 0 | 0.03 Ti | 75 | 600 | 47 | 490 | 10.4 | crystalline | 36 | embodiment |
| 34 | TiAlN | 0.49 | 0.48 | 0 | 0.03 Zr | 75 | 600 | 43 | 450 | 10.5 | crystalline | 41 | embodiment |
| 35 | TiAlN | 0.49 | 0.48 | 0 | 0.03 Hf | 75 | 600 | 44 | 470 | 10.7 | crystalline | 43 | embodiment |
| 36 | TiAlN | 0.49 | 0.48 | 0 | 0.03 V | 75 | 600 | 46 | 485 | 10.5 | crystalline | 38 | embodiment |
| 37 | TiAlN | 0.49 | 0.48 | 0 | 0.03 Nb | 75 | 600 | 43 | 455 | 10.6 | crystalline | 42 | embodiment |
| 38 | TiAlN | 0.49 | 0.48 | 0 | 0.03 Ta | 75 | 600 | 45 | 480 | 10.7 | crystalline | 40 | embodiment |
| 39 | TiAlN | 0.49 | 0.48 | 0 | 0.03 Cr | 75 | 600 | 48 | 500 | 10.4 | crystalline | 36 | embodiment |
| 40 | TiAlN | 0.49 | 0.48 | 0 | 0.03 Mo | 75 | 600 | 46 | 495 | 10.8 | crystalline | 39 | embodiment |
| 41 | TiAlN | 0.49 | 0.48 | 0 | 0.03 W | 75 | 600 | 44 | 475 | 10.8 | crystalline | 42 | embodiment |
| 42 | TiAlN | 0.49 | 0.48 | 0 | 0.03 Ru | 75 | 600 | 43 | 480 | 11.2 | crystalline | 43 | embodiment |
| 43 | TiAlN | 0.49 | 0.48 | 0 | 0.03 Al | 75 | 600 | 45 | 490 | 10.9 | crystalline | 40 | embodiment |
| 44 | TiAlN | 0.45 | 0.47 | 0.05 | 0.03 B | 75 | 600 | 50 | 500 | 10.0 | crystalline | 33 | embodiment |
| 45 | TiAlN | 0.45 | 0.47 | 0.05 | 0.03 Ti | 75 | 600 | 47 | 450 | 9.6 | crystalline | 35 | embodiment |
| 46 | TiAlN | 0.45 | 0.47 | 0.05 | 0.03 Cr | 75 | 600 | 48 | 475 | 9.9 | crystalline | 37 | embodiment |
| 47 | TiAlN | 0.45 | 0.47 | 0.05 | 0.03 Nb | 75 | 600 | 43 | 420 | 9.8 | crystalline | 39 | embodiment |

(*)Composition of 2nd coating layer: $Si_xC_{1-x-y-z}N_yM_z$

[Fabrication of Samples 48 to 61]

Samples 48 to 61 have the structures shown in FIG. 1B. Table 3 shows the compositions of fabricated samples. An SiC target was mounted on the sputter vapor source 18. A target composed of a metal or alloy shown in the column of "1st coating layer"—"composition" of table 3 was mounted on the arc evaporation source 22 as needed. As the substrate 2, a mirror-polished substrate (JIS P Type) made of a cemented formed with a bias voltage of −80 V and with the temperature of the substrate 2 being at 550° C., thereby an SiC coating layer having a thickness of about 3 μm was formed as the second coating layer 5 on the first coating layer 4. It is noted that the composition of the second coating layer 5 shown in Table 3 is represented by composition analysis values obtained by EDX, which will be described later and was the same as the composition of SiC target.

TABLE 3

| | 1st coating layer | | | critical | wear | |
|---|---|---|---|---|---|---|
| sample No. | composition | thickness (μm) | 2nd coating layer | load (N) | amount (μm) | result |
| 48 | TiN | 1 | $Si_{0.5}C_{0.5}$(=SiC) | 55 | 85 | embodiment |
| 49 | TiC | 1 | $Si_{0.5}C_{0.5}$ | 50 | 80 | embodiment |
| 50 | CrN | 1 | $Si_{0.5}C_{0.5}$ | 70 | 45 | embodiment |
| 51 | $(Ti_{0.5}Al_{0.5})N$ | 1 | $Si_{0.5}C_{0.5}$ | 85 | 40 | embodiment |

TABLE 3-continued

| sample No. | 1st coating layer composition | thickness (μm) | 2nd coating layer | critical load (N) | wear amount (μm) | result |
|---|---|---|---|---|---|---|
| 52 | $(Ti_{0.5}Al_{0.5})N$ | 0.005 | $Si_{0.5}C_{0.5}$ | 50 | 70 | embodiment |
| 53 | $(Ti_{0.5}Al_{0.5})N$ | 0.01 | $Si_{0.5}C_{0.5}$ | 70 | 60 | embodiment |
| 54 | $(Ti_{0.5}Al_{0.5})N$ | 0.1 | $Si_{0.5}C_{0.5}$ | 80 | 50 | embodiment |
| 55 | $(Ti_{0.5}Al_{0.5})N$ | 2 | $Si_{0.5}C_{0.5}$ | 85 | 42 | embodiment |
| 56 | $(Ti_{0.5}Al_{0.5})N$ | 5 | $Si_{0.5}C_{0.5}$ | 80 | 45 | embodiment |
| 57 | $(Ti_{0.5}Al_{0.5})N$ | 7 | $Si_{0.5}C_{0.5}$ | 70 | 65 | embodiment |
| 58 | $(Ti_{0.2}Cr_{0.1}Al_{0.7})N$ | 1 | $Si_{0.5}C_{0.5}$ | 90 | 40 | embodiment |
| 59 | $(Cr_{0.4}Al_{0.6})N$ | 1 | $Si_{0.5}C_{0.5}$ | 80 | 41 | embodiment |
| 60 | $(Ti_{0.2}Cr_{0.2}Al_{0.57}Si_{0.03})N$ | 1 | $Si_{0.5}C_{0.5}$ | 85 | 45 | embodiment |
| 61 | $(Ti_{0.2}Cr_{0.2}Al_{0.55}Si_{0.03}Y_{0.02})N$ | 1 | $Si_{0.5}C_{0.5}$ | 80 | 43 | embodiment |

[Fabrication of Samples 62 to 75]

Samples 62 to 75 have the structures shown in FIG. 1C. Table 4 shows the compositions of fabricated samples. An SiC target was mounted on the sputter vapor source 18. A target made of a various metal or a various alloy shown in the column of "1st coating layer"—"bottom layer" and in the column of "1st coating layer"—"intermediate layer"—"composition" in the Table 4 was mounted on the arc evaporation source 22 as needed. As the substrate 2, a mirror-polished substrate (JIS P Type) made of a cemented carbide, and a 2-flute ball end mill having a diameter of 10 mm and being made of the same cemented carbide as the mirror-polished substrate were used. These were mounted on the stage 14.

After the pressure inside the chamber 10 was lowered to $1\times10^{-3}$ Pa or below, the substrate 2 was heated to 550° C. by the heater 16. After that, sputter cleaning using Ar ions was performed. In this state, an electric current of 150 A was supplied from the arc power supply 28 to the arc evaporation source 22 to generate arc discharge. In this way, a TiAlN coating layer as the bottom layer was formed on the surface of the substrate 2. After exhausting the $N_2$ gas inside the chamber 10, Ar gas was introduced into the chamber 10 so that the internal pressure became 0.6 Pa. The magnetron sputtering was performed with a bias voltage of −80 V and with the temperature of the substrate 2 being at 550° C., thereby an SiC coating layer having the thickness shown in the column of "second coating layer" in Table 4 was formed as the second coating layer 5 on the previously formed TiAlN coating layer.

Subsequently, this SiC coating layer was coated with a nitride, a carbonitride, or a carbide shown in the column of "1st coating layer"—"intermediate layer" in Table 4. The intermediate layer was formed under the condition that is the same as used for forming the TiAlN coating layer as the bottom layer of the first coating layer 4. After that, the SiC coating layers as the second coating layers 5 and the intermediate layers were formed until the thickness of the coating layers reached 3 μm. In this way, the multi-layered hard coating layer 7 was formed. It is noted that the composition of the second coating layer 5 shown in Table 4 is represented by composition analysis values obtained by EDX, which will be explained later, and was the same as the composition of the SiC target.

TABLE 4

| | 1st coating layer | | | 2nd coating layer | | total | | | | | |
|---|---|---|---|---|---|---|---|---|---|---|---|
| | | inetermediate layer | | | | | | | | | |
| sample No. | bottom layer | composition | thickness (nm) | composition | thickness (nm) | thickness (μm) | hardness (GPa) | Young's modulus (GPa) | critical load (N) | wear amount (μm) | result |
| 62 | TiAlN | TiN | 20 | $Si_{0.5}C_{0.5}(=SiC)$ | 20 | 3 | 46 | 480 | 50 | 80 | embodiment |
| 63 | TiAlN | TiC | 20 | $Si_{0.5}C_{0.5}$ | 20 | 3 | 45 | 480 | 50 | 85 | embodiment |
| 64 | TiAlN | CrN | 20 | $Si_{0.5}C_{0.5}$ | 20 | 3 | 45 | 470 | 60 | 55 | embodiment |
| 65 | TiAlN | $(Ti_{0.5}Al_{0.5})N$ | 20 | $Si_{0.5}C_{0.5}$ | 20 | 3 | 46 | 490 | 80 | 40 | embodiment |
| 66 | TiAlN | $(Ti_{0.2}Cr_{0.1}Al_{0.7})N$ | 20 | $Si_{0.5}C_{0.5}$ | 20 | 3 | 48 | 510 | 90 | 37 | embodiment |
| 67 | TiAlN | $(Cr_{0.4}Al_{0.6})N$ | 20 | $Si_{0.5}C_{0.5}$ | 20 | 3 | 47 | 500 | 90 | 45 | embodiment |
| 68 | TiAlN | $(Ti_{0.2}Cr_{0.2}Al_{0.57}Si_{0.03})N$ | 20 | $Si_{0.5}C_{0.5}$ | 20 | 3 | 50 | 520 | 90 | 35 | embodiment |
| 69 | TiAlN | $(Ti_{0.5}Al_{0.5})N$ | 5 | $Si_{0.5}C_{0.5}$ | 5 | 3 | 46 | 480 | 60 | 65 | embodiment |
| 70 | TiAlN | $(Ti_{0.5}Al_{0.5})N$ | 10 | $Si_{0.5}C_{0.5}$ | 10 | 3 | 50 | 530 | 80 | 40 | embodiment |
| 71 | TiAlN | $(Ti_{0.5}Al_{0.5})N$ | 30 | $Si_{0.5}C_{0.5}$ | 30 | 3 | 48 | 510 | 80 | 40 | embodiment |
| 72 | TiAlN | $(Ti_{0.5}Al_{0.5})N$ | 100 | $Si_{0.5}C_{0.5}$ | 100 | 3 | 46 | 490 | 80 | 55 | embodiment |
| 73 | TiAlN | $(Ti_{0.5}Al_{0.5})N$ | 200 | $Si_{0.5}C_{0.5}$ | 200 | 3 | 45 | 480 | 70 | 60 | embodiment |
| 74 | TiAlN | $(Ti_{0.5}Al_{0.5})N$ | 500 | $Si_{0.5}C_{0.5}$ | 500 | 3 | 44 | 470 | 70 | 70 | embodiment |
| 75 | TiAlN | $(Ti_{0.2}Cr_{0.2}Al_{0.55}Si_{0.03}Y_{0.02})N$ | 20 | $Si_{0.5}C_{0.5}$ | 20 | 3 | 48 | 500 | 80 | 35 | embodiment |

<<Evaluation of Samples>>

[Evaluation of Hardness of Formed Hard Coating Layer and Young's Modulus]

Hardness and Young's modulus of the hard coating layer 6 in the samples 1 to 47 and of the hard coating layer 7 formed on the samples 62 to 75 were obtained by a nano indentation method. A measuring method and a calculation method which were used in the present invention were in conformity with the international standard (ISO14577-1 to ISO14577-44) related to the nano-indentation. A Berkovich indentor made of diamond was used in the measurement of nano-indentation, and a maximum indentation load was adjusted so that an indentation depth is equal to or shallower than 1/10 of the thickness of the hard coating layers 6 and 7 to be measured. The hardness obtained here was an HIT (indentation hardness) defined by the International Organization for Standardization (ISO). Tables 1, 2 and 4 show the measurement results. It is noted that the hardness of the hard coating layer and the Young's modulus of the samples 48 to 61 were not measured.

[Composition Analysis of the Formed Second Coating Layer]

The composition of the second coating layer 5 formed on the substrate 2 was measured for each sample by means of an energy dispersive X-ray analyzer (EDX). Tables 1 to 4 show the measurement results.

[Analysis of Crystallinity of Formed Second Coating Layer]

The crystallinity of the second coating layer 5 formed on the substrate 2 was analyzed for each sample by X-ray diffraction (Cukα ray, 40 kV −40 mA, θ−2θ, 1° of divergence slit, 10 mm of divergence vertical limit slit, 1° of scattering slit, 0.15 mm of receiving slit, 0.8 mm of monochromator receiving slit). FIG. 3 shows a typical X-ray diffraction pattern of the crystalline SiC (cubic) coating layer. The second film 5 layer was determined to be crystalline if a full width of half maximum of a peak of SiC (denoted as SiC in FIG. 3) is equal to or smaller than 3° measured at a diffraction angle (2θ) of about 35° (e.g. 34° to 36°) in the X-ray diffraction pattern. It is noted that, if the peak of the crystalline (cubic) SiC is measured at around 35°, and if the FWHM is equal to or greater than 2° and not greater than 3°, the second coating layer 5 is defined to form a complex composition including the crystalline (cubic) SiC and the amorphous SiC. In the present invention, such second coating layer 5 is crystalline. On the other hand, if the FWHM exceeds 3°, such second coating layer 5 is determined to be amorphous. It is noted that, the XRD chart shown in FIG. 3 also shows the peak of WC—Co, i.e., the substrate 2, and the peak of TiAlN coating layer formed as the first coating layer 4.

[Evaluation of Adhesiveness of Hard Coating Layer]

The adhesiveness of the hard coating layers 6 and 7 formed on the substrate 2 was evaluated for each of samples 48 to 75 by a scratch test. The scratch test was carried out by moving a diamond indenter of 200 μmR on the coating layer at a moving speed of 10 mm/min. and at a load-increasing rate of 100 N/min. For the value of critical load, a critical load of friction force was adopted. Tables 3 and 4 show the evaluation results.

[Evaluation of Wear Resistance—First Cutting Test]

Ball end mills having the coating layers of the samples Nos. 1 to 75 were prepared and a cutting test was carried out under conditions described below. The length of a worn area of the hard coating layer 6 or 7 from the tip of the ball end mill was measured after the test, and the wear resistance was determined insufficient if the length was equal to or longer than 100 μm. The test results after the test were shown in Tables 1 to 4.

Work piece: SKD61 (HRC50)
Cutting speed: 220 m/min.
Feed: 0.06 mm/tooth
Axial cutting depth: 5 mm
Radial cutting depth: 0.6 mm
Length of cut: 100 m
Cutting environment: down-cut, dry atmosphere (air blow only)

<<Test Result>>

[Samples 1 to 25]

In Sample 1, the second coating layer 5 became amorphous because the amount of Si (x) of Sample 1 was smaller than 0.4. In Sample 5, the second coating layer 5 became amorphous because the amount Si(x) exceeded 0.6. In Sample 6, the second coating layer 5 became amorphous because the applied bias voltage used when forming the second coating layer 5 was 0 V. In Sample 12, the second coating layer 5 became amorphous because the applied bias voltage was −400 V when forming the second coating layer 5. In Sample 13, the second coating layer 5 became amorphous because the temperature of the substrate 2 was 200° C. which was too low for crystallizing the second coating layer 5. In Sample 14, the second coating layer 5 became amorphous because the substrate 2 was 300° C. which was too low for crystallizing the second coating layer 5. In Sample 25, the second coating layer 5 became amorphous because the atomic ratio y of N exceeded 0.1. In these samples, the wear amount was equal to or greater than 100 μm because the hardness of the second coating layer 5 was not greater than 30 GPa as shown in Table 1. In Sample 21, the substrate 2 had thermal deterioration because the substrate 2 was heated to 800° C. when forming the second coating layer 5. From the results above, these samples were determined to be comparative examples, which do not belong to the present invention. The other samples shown in Table 1 were determined to belong to the embodiments of the present.

[Samples 26 to 47]

In Sample 30, the wear amount was equal to or greater than 100 μm because the atomic ratio z of the element M included in the second coating layer 5 exceeded 0.2, and because the hardness of the second coating layer 5 was reduced to 31 GPa. In the embodiment shown in FIG. 1, the hardness of the second coating layer 5 is 36 to 44 GPa, and the hardness of the second coating layer 5 in Samples 26 to 29 and 31 to 47 is 43 to 50 GPa. This confirms that the hardness of the second coating layer 5 tends to increase if the element M is added. Also, the wear amount was maintained equal to or lower than 43 μm. From these results, Sample 30 was determined to be a comparative example, and the other samples were determined to belong to the embodiments of the present invention as shown in Table 1.

[Samples 48 to 61]

As shown in Table 3, Samples 48 to 61 were determined to belong to the embodiments. When comparing Samples 51 to 57, a critical load was greater and the wear amount was fewer if the thickness of the first coating layer 4 was 2 μm to 5 μm. It turned out that the thinner the first coating layer was than 2 μm, the lower the adhesiveness became reduced. This is because there is a case in which the substrate 2 is not coated sufficiently with the first coating layer 4 if the thickness of the first coating layer 4 was not sufficiently thick due to surface roughness or defects of the substrate 2. It also turned out that the adhesiveness lowers when the thickness of the first coating layer 4 exceeded 5 μm. This is because there is a case in which deformation or failure occurs on the first coating layer 4 that is an underlayer, which results in the second coating layer 5 peeled off if the thickness of a layer having a lower hardness becomes thick relative to the thickness of the second coating layer 5 having a greater hardness. It is possible to confirm from Table 3 that the wear resistance is good when Al is contained in the first coating layer 4 as its component.

[Samples 62 to 75]

As shown in Table 4, Samples 62 to 75 were determined to belong to the embodiments of the present invention. The hardness of the second coating layer 5 in the embodiments shown in Table 1 is 36 to 44 GPa, and the hardness of the hard coating layer 7 having the multi-layered structure of the Samples 62 to 75 is 45 to 50 GPa; therefore, it was confirmed that the hardness increases by forming the multi-layer structure of the first coating layer 4 and the second coating layer 5 in the multi-layered structure.

<<Second Cutting Test>>

An insert (type: CNMG 120408 TF, ADCT 1505 PDFR) made of a cemented carbide (of which material will be described later) was used as the substrate 2 and was set within the chamber 10. After the pressure inside the chamber was lowered to be equal to or lower than 10 to $1\times10^{-3}$ Pa, the substrate 2 was heated by the heater 16° C. to 550° C. After that, a Sputter cleaning was carried out by using Ar ions. In this state, an electric current of 150 A was supplied from the arc power supply 28 to the arc evaporation source 22 to generate arc discharge. In this way, a TiAlN coating layer as the bottom layer having a thickness of about 1 µm was formed on the surface of the substrate 2. After exhausting the $N_2$ gas from inside the chamber 10, Ar gas was introduced into the chamber 10 so that the internal pressure became 0.6 Pa. The magnetron sputtering was performed with a bias voltage of −80 V and with the temperature of the substrate 2 being kept at 600° C., thereby an SiC ($Si_{0.5}C_{0.5}$) coating layer as the second coating layer 5 having a thickness of about 3 µm was formed on the TiAlN coating layer. Hereinafter, the insert thus fabricated is referred to as "an insert of the embodiments". An insert in which a TiAlN coating layer having a thickness of 4 µm was formed on the substrate 2 was fabricated for the purpose of comparison (referred to as an "insert of comparative example). The following cutting tests 1 to 3 were carried out by using those inserts. The tool life of the insert was evaluated by a time in which the insert could be used for cutting.

[Cutting Test 1: Turning of Inconel (Registered Trademark)]
Work piece: Inconel 718 (35HRC)
Tool model: CNMG 12408 TF
Martial of substrate: WC+6% Co
Turning condition: wet cutting (with coolant)
Cutting Speed: 25 m/min.
Feed: 0.08 mm/rev.
Cutting depth: 1 mm In the cutting test 1, the tool life of the insert of the comparative example was 9 minutes. In contrast, the tool life of the insert of the embodiment was 13 minutes, which was about 1.44 times longer than the tool life of the insert of the comparative example.

[Cutting Test 2: Turning of Hardened Stainless Steel]
Work piece: D2 (62HRC)
Tool model: CNMG 120408 TF
Martial of substrate: WC+6% Co
Cutting condition: wet cutting (with coolant)
Cutting speed: 40 m/min.
Feed: 0.15 mm/rev.
Cutting depth: 0.3 mm In the cutting test 2, the tool life of the insert of the comparative example was 8 minutes. In contrast, the tool life of the insert of the embodiment was 14 minutes which was about 1.75 times longer than the tool life of the insert of the comparative example.

[Cutting Test 3: Cutting Stainless Steel by Face Milling]
Work piece: AISI316
Tool model: ADCT 1505 PDFR
Material of substrate: WC+12% Co
Cutting condition: dry cutting
Cutting speed: 120 m/min.
Feed: 0.12 mm/rev.
Cutting depth: 4 mm In the cutting test 3, the tool life of the insert of the comparative example was 34 minutes. In contrast, the tool life of the insert of the embodiment was 53 minutes. That is, the tool life of the insert of the embodiment was about 1.56 times longer than the tool life of the insert of the comparative example.

The invention claimed is:

1. A hard coating layer which is formed by a PVD method and coats a predetermined substrate, wherein
the hard coating layer including Si and C as essential components, and an element M and N as optional components, the element M including at least one of elements selected from among group 3A elements, group 4A elements, group 5A elements, group 6A elements, B, Al, and Ru,
the hard coating layer having a composition of $Si_xC_{1-x-y-z}N_yM_z$ (where $0.4 \leq x \leq 0.6$, $0 \leq y \leq 0.1$, and $0 \leq z \leq 0.2$),
wherein a full width of half maximum of an SiC peak observed at a diffraction angle between 34° and 36° is equal to or smaller than 3° when X-ray diffraction (XRD) is measured with a CuKα ray.

2. The hard coating layer according to claim 1, wherein a crystalline structure of the $Si_xC_{1-x-y-z}N_yM_z$ belongs to a cubic crystal system.

3. The hard coating layer according to claim 1, which is substantially SiC crystal.

4. The hard coating layer according to claim 1, which contains amorphous SiC.

5. The hard coating layer according to claim 1, wherein the substrate is cemented carbide.

6. The hard coating layer according to claim 1, which contains M.

7. The hard coating layer according to claim 6, wherein M is one or more elements selected from the group consisting of B, Cr, V and Ti.

8. The hard coating layer according to claim 1, which contains N.

9. The hard coating layer according to claim 1, which contains M and N.

10. A hard coating layer which is formed by a PVD method, the hard coating layer having a structure in which at least one layer of a first coating layer and at least one layer of a second coating layer are formed alternately, the first coating layer for coating a predetermined substrate being formed on a surface of the predetermined substrate, wherein
the first coating layer is composed of a nitride, a carbonitride, or a carbide which contains at least one element selected from among group 4A elements, group 5A elements, and group 6A elements as an essential component and at least one element selected from among group 3A elements, Si, Al, and B as an optional component, and
the second coating layer has essential components and optional components, Si and C being the essential components, an element M and N being the optional components, the element M including at least one element selected from among group 3A elements, group 4A elements, group 5A elements, group 6A elements, B, Al, and Ru, the second coating layer having a composition of $Si_xC_{1-x-y-z}N_yM_z$ (where $0.4 \leq x \leq 0.6$, $0 \leq y \leq 0.1$, and $0 \leq z \leq 0.2$) and a full width of half maximum of an SiC peak observed at a diffraction angle between 34° and 36° is equal to or smaller than 3° when X-ray diffraction is carried by using a CuKα ray.

11. A method of forming a hard coating layer on a surface of a predetermined substrate, the hard coating layer having a composition of $Si_xC_{1-x-y-z}N_yM_z$ (where $0.4 \leq x \leq 0.6$, $0 \leq y \leq 0.1$, and $0 \leq z \leq 0.2$), where M is at least one element selected from among group 3A elements, group 4A elements, group 5A elements, group 6A elements, B, Al, and Ru; and a full width of half maximum of an SiC peak observed at a diffraction angle between 34° and 36° is equal to or smaller than 3° when X-ray diffraction is carried by using a CuKα ray, the method comprising:

keeping the substrate at a predetermined temperature between 400° C. and 800° C., and a predetermined bias voltage of −30V to −300V being applied to the substrate, the predetermined bias voltage being maintained; and forming the hard coating layer on the surface of the substrate by a PVD method.

12. The method of forming the hard coating layer according to claim 11, wherein the PVD method is a magnetron sputtering method.

13. The method of forming the hard coating layer according to claim 11 or 12, wherein before the hard coating layer is formed, an additional hard coating layer is formed which is made of a nitride, a carbonitride, or a carbide, the additional hard coating containing at least one element selected from among group 4A elements, group 5A elements, and group 6A elements as an essential component and at least one element selected from among group 3A elements, Si, Al, and B as an optional component.

14. The method of forming the hard coating layer according to claim 13, wherein the additional hard coating layer and the hard coating layer are formed alternately by a plurality of times.

* * * * *